(12) United States Patent
Gokhale et al.

(10) Patent No.: US 10,153,831 B1
(45) Date of Patent: Dec. 11, 2018

(54) POWER USAGE-AWARE SPECTRAL RESOURCE ALLOCATION IN A SATELLITE LONG TERM EVOLUTION (LTE) COMMUNICATION SYSTEM

(71) Applicant: LOCKHEED MARTIN CORPORATION, Bethesda, MD (US)

(72) Inventors: Dilip S. Gokhale, Germantown, MD (US); Xiangdong Liu, Boyds, MD (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/846,114

(22) Filed: Dec. 18, 2017

Related U.S. Application Data

(60) Provisional application No. 62/458,539, filed on Feb. 13, 2017.

(51) Int. Cl.
| | | |
|---|---|---|
| *H04W 4/00* | (2018.01) | |
| *H04B 7/185* | (2006.01) | |
| *H04W 52/26* | (2009.01) | |
| *H04W 52/34* | (2009.01) | |

(52) U.S. Cl.
CPC ...... *H04B 7/18543* (2013.01); *H04W 52/262* (2013.01); *H04W 52/265* (2013.01); *H04W 52/343* (2013.01)

(58) Field of Classification Search
CPC ............ H04B 7/18543; H04B 7/18521; H04B 7/18541; H04W 52/262; H04W 52/265; H04W 52/343; H04W 36/0005; H04W 36/0088; H03F 2200/15; H03F 2200/18; H03F 2200/211; H03F 2200/222; H05K 999/99

USPC .......... 455/430, 450, 88; 370/315, 330, 347, 370/329
See application file for complete search history.

(56) References Cited

U.S. PATENT DOCUMENTS

| | | | |
|---|---|---|---|
| 6,570,859 B1* | 5/2003 | Cable ................ | H04B 7/18515 370/316 |
| 2002/0041328 A1* | 4/2002 | LeCompte .......... | G01C 11/025 348/144 |
| 2004/0185775 A1* | 9/2004 | Bell ................... | H04B 7/18515 455/12.1 |

(Continued)

FOREIGN PATENT DOCUMENTS

| | | | | |
|---|---|---|---|---|
| KR | 20130125280 A | * | 11/2013 | .......... H04W 52/146 |
| KR | 20130125281 A | * | 11/2013 | ............. H04W 4/06 |

(Continued)

*Primary Examiner* — Mahendra Patel
(74) *Attorney, Agent, or Firm* — Morgan, Lewis & Bockius LLP

(57) ABSTRACT

A method for resource allocation in a multi-beam satellite LTE network includes determining, via a communication processor, a per sub-frame resource block (RB) threshold value on a per-beam and per-LTE carrier basis, based on a total transmission power and shared power amplifiers available to multiple beams of a space vehicle while ensuring that power amplifiers operate in a linear amplification region. The method further includes communicating the LTE per subframe RB threshold value to a downlink LTE scheduler function within the eNode-B to ensure that the count of subframe level RB allocations is less than the determined LTE per subframe RB threshold value.

20 Claims, 11 Drawing Sheets

(56) References Cited

U.S. PATENT DOCUMENTS

| | | | |
|---|---|---|---|
| 2010/0068993 A1 | 3/2010 | Khan | |
| 2010/0280907 A1 | 11/2010 | Wolinsky et al. | |
| 2012/0058791 A1* | 3/2012 | Bhattad | H04L 1/0606 455/509 |
| 2012/0154055 A1* | 6/2012 | Yamamoto | H03F 1/56 330/299 |
| 2014/0226502 A1* | 8/2014 | Behnamfar | H04L 1/00 370/252 |
| 2015/0327328 A1 | 11/2015 | Novak et al. | |
| 2016/0219569 A1* | 7/2016 | Kuo | H04W 72/042 |
| 2016/0366687 A1* | 12/2016 | Guo | H04L 1/1812 |
| 2017/0019882 A1 | 1/2017 | Nimbalker et al. | |
| 2017/0041830 A1* | 2/2017 | Davis | H04W 36/0005 |

FOREIGN PATENT DOCUMENTS

| | | | | |
|---|---|---|---|---|
| KR | 20160053562 A | * | 5/2016 | H04B 7/185 |
| WO | WO 2013168872 A1 | * | 11/2013 | H04B 7/18563 |
| WO | WO 2013168880 A1 | * | 11/2013 | H04W 52/08 |

* cited by examiner $$A = \begin{bmatrix} a_{1,1} & a_{1,2} & \cdots & a_{1,N} \\ a_{2,1} & a_{2,2} & \cdots & a_{2,N} \\ \vdots & \vdots & \ddots & \vdots \\ a_{M,1} & a_{M,2} & \cdots & a_{M,N} \end{bmatrix}, \text{ where } \sum_{i=0}^{M} a_{i,j} = 1 \text{ for } j = 1, 2, \ldots, N$$

$$B = \begin{bmatrix} b_{1,1} & b_{1,2} & \cdots & b_{1,P} \\ b_{2,1} & b_{2,2} & \cdots & b_{2,P} \\ \vdots & \vdots & \ddots & \vdots \\ b_{N,1} & b_{N,2} & \cdots & b_{N,P} \end{bmatrix}, \text{ where } b_{j,k}=1 \text{ for only one row } j \text{ in any column } k, \text{ and all other entries in column } k \text{ are } 0$$

$C = A * B$, where * is matrix multiplication

FIG. 6A $$A = \begin{bmatrix} 0.6 & 0.4 & 0 & 0 \\ 0.4 & 0.6 & 0 & 0 \\ 0 & 0 & 1 & 1 \end{bmatrix}$$

$$B = \begin{bmatrix} 1 & 1 & 0 & 0 & 0 & 0 \\ 0 & 0 & 1 & 1 & 0 & 0 \\ 0 & 0 & 0 & 0 & 1 & 1 \end{bmatrix}$$

$$C = \begin{bmatrix} 0.6 & 0.6 & 0.4 & 0.4 & 0 & 0 \\ 0.4 & 0.4 & 0.6 & 0.6 & 0 & 0 \\ 0 & 0 & 0 & 0 & 1 & 1 \end{bmatrix}$$

FIG. 6B

POWER USAGE-AWARE SPECTRAL RESOURCE ALLOCATION IN A SATELLITE LONG TERM EVOLUTION (LTE) COMMUNICATION SYSTEM

CROSS-REFERENCE TO RELATED APPLICATIONS

This application claims the benefit of priority under 35 U.S.C. § 119 from U.S. Provisional Patent Application 62/458,539 filed Feb. 13, 2017, which is incorporated herein by reference in its entirety.

STATEMENT REGARDING FEDERALLY SPONSORED RESEARCH OR DEVELOPMENT

Not applicable

FIELD OF THE INVENTION

The present invention generally relates to satellite communications, and more particularly, to power usage-aware spectral resource allocation in satellite communication systems based on Long Term Evolution (LTE) technology.

BACKGROUND

A satellite communications system may have limited resources in terms of available power and spectrum. Such a system usually has a multi-beam antenna or multiple antennas to provide coverage over a large coverage area in a satellite field of view on the earth. The anticipated communications traffic demand across the coverage area is usually unevenly distributed and may even change over time. Providing communication services via satellite requires the allocation of spectral (e.g., frequency/polarization) and associated power resources (for signal amplification) in each of the satellite beams. The total power needed for the available spectral resources is typically lower than the available power that the satellite can provide. A communications satellite typically includes multiple power amplifiers (PAs), each of which can amplify the signals (including user traffic signals) to a subset of beams. PAs are designed to provide linear amplification of incoming signals up to a certain operating point. Operating the PA beyond this point leads to non-linear amplification that results in degradation of the communications signal. Accordingly, the goal of a satellite communications system is to ensure that the PAs operate within the allocated power limit and in the linear amplification region. The spectral resource allocation to different beams should thus account for the power thresholds at the entire satellite level and to ensure that all PAs operate in a linear amplification region. This disclosure is in the context of the use of spectral and power resources required within a Long Term Evolution (LTE) network over satellite. While LTE was designed for use in terrestrial wireless networks, it also has several benefits for deployment over a satellite network. In order to attain these benefits, several adaptations are needed—a primary one being the allocation of spectral resources while taking into account the onboard power and PA constraints.

SUMMARY

According to various aspects of the subject technology, methods and configuration for power usage-aware spectral resource allocation in satellite communication systems when using the LTE system are provided.

The subject technology, addresses satellite communication limited resources by providing an optimization algorithm. The optimization algorithm takes into account the traffic demand associated with long term evolution (LTE) carriers in different beams to fairly allocate the available spectral resources such that the overall satellite power limit is not exceeded and that the PAs operate in a linear amplification region. Specifically, the optimization algorithm takes into account the LTE waveform and spectral resources in the form of resource blocks (RBs). The LTE resource grid structure in the time dimension is based on a 10 msec frame with each frame consisting of ten sub-frames that are 1 msec in duration. Each sub-frame further consists of two 0.5 msec time-slots. Each time-slot consists of multiple RBs each of which consists of 12 consecutive sub-carriers, or 180 kHz. The number of RBs in a time-slot depends upon the size of the LTE carrier. For instance there are 6 RBs in the 1.4 MHz carrier (usable BW of 1.08 MHz), and 15 RBs in a 3 MHz carrier (usable bandwidth of 2.5 MHz). The RBs represent assignable units of resource allocation (bandwidth & time) for traffic to and/or from users.

In one or more other aspects, a method for resource allocation in a multi-beam satellite LTE network includes determining by a communication processor, a resource block (RB) threshold value for subframe resource allocations corresponding to an LTE resource grid based on a total transmission power available to multiple beams of a space vehicle and that the PAs operate in a linear amplification region. The downlink scheduler within the communication processor allocates one or more RBs within a subframe of the LTE resource grid on a per LTE carrier basis subject to the maximum determined by the RB threshold value.

In one or more other aspects, a multi-beam satellite system for resource allocation in a long-term evolution (LTE) network includes a base station (referred to as enhanced Node-B or eNodeB) having a communication processor and one or more terminal devices that can communicate with the base station. The communication processor may determine a resource block (RB) threshold value for subframe resource allocations based on a total transmission power and desired PA operating point. The RB threshold is determined based on a proportional distribution of the anticipated traffic demand associated with each LTE carrier. The RB threshold serves the purpose of capping the number of RBs that can be allocated by the D/L scheduler on a per LTE carrier basis. The D/L scheduler within the communication processor can then allocate in real-time one or more RBs to a subframe of the LTE resource grid as long as the determined RB threshold value is not exceeded.

In yet one or more other aspects, a method of adapting long-term evolution (LTE) over satellite, includes shifting frame boundaries of LTE carriers in integral increments of subframes to reduce control channel overlap, related excessive power draw and the possibility of driving power amplifiers (PAs) into non-linear region of amplification. The method may further include changing control channel transmission schedule from once every frame on every LTE carrier to a repeating pattern. The control channel includes primary synchronization signal (PSS), secondary synchronization signal (SSS) and physical broadcast channel (PBCH). The repeating pattern includes changing the control channel transmission schedule once in each of four consecutive frames.

The foregoing has outlined rather broadly the features of the present disclosure in order that the detailed description

3 that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure, wherein:

FIGS. 6A and 6B illustrate matrices representing carrier-to-amplifier mapping and an example calculation of per power amplifier (PA) power in an LTE subframe.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

The subject technology provides an optimization algorithm that addresses limited satellite on-board resources. The optimization algorithm in the context of a satellite LTE system ensures that spectral resources (LTE RBs) are allocated in such a way that all PAs together use an aggregate amount of power below that budgeted for the PAs and each PA operates in its linear amplification region.

Figure 1:
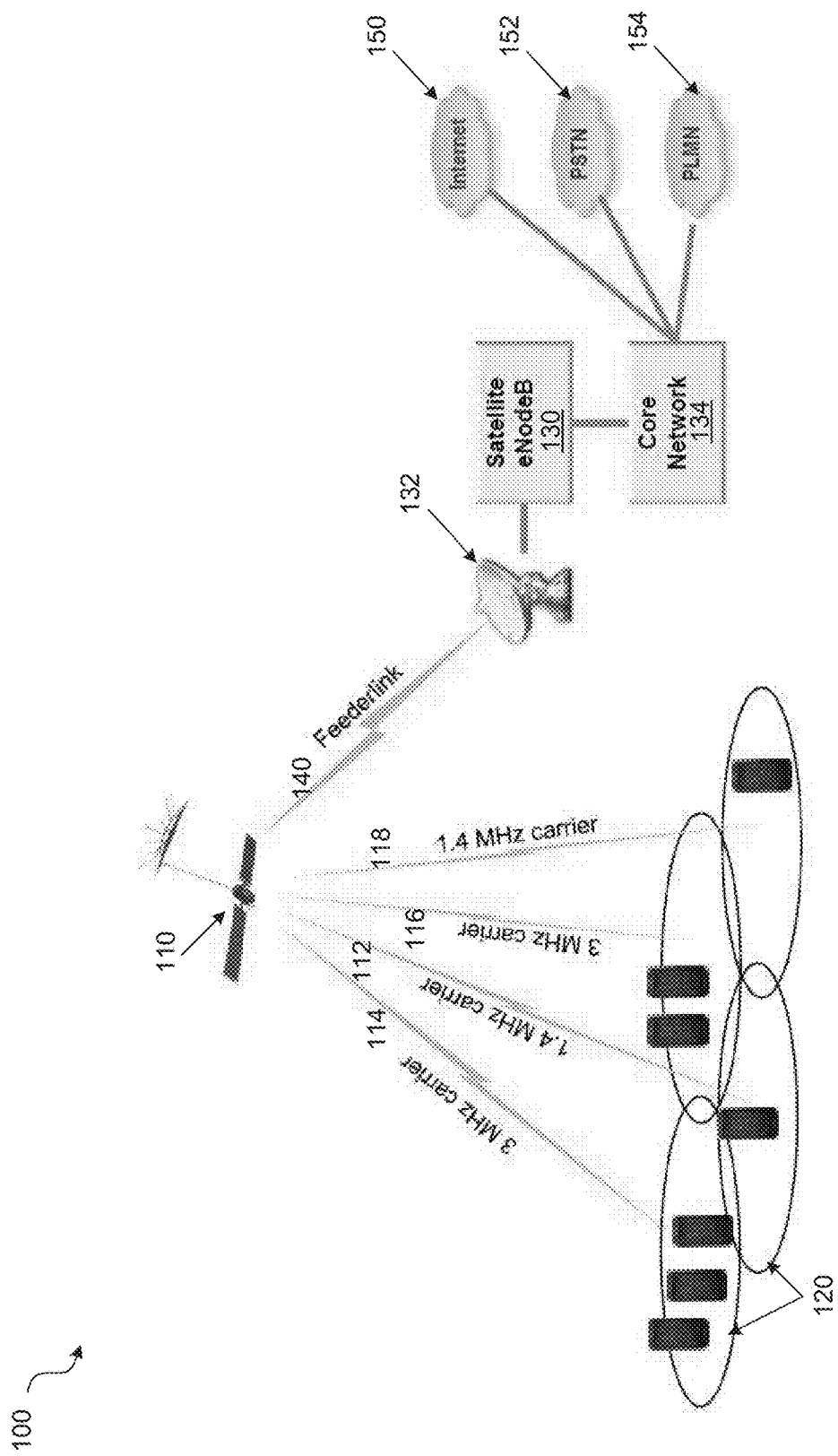
FIG. 1 is a high-level diagram illustrating an example environment for deployment of a satellite system with LTE technology, according to certain aspects of the disclosure.

FIG. 1 is a high-level diagram illustrating an example environment 100 for deployment of a satellite system with LTE technology, according to certain aspects of the disclosure. The environment 100 includes a space vehicle (e.g., a satellite) 110, terminal devices 120, a multi-cell satellite base station (e.g., eNodeB or eNB) 130, a satellite antenna

4

(e.g., a reflector antenna, such as a dish antenna) 132, and a core network 134, which is communicatively coupled to a number of networks such as the Internet 150, a public switched telephone network (PSTN) 152 and a public land mobile network (PLMN) 154. The terminal devices 120, also referred to as user equipment (UE), are coupled to the satellite 110 via a number of LTE communication channels such as channels 112 (e.g., 1.4 MHz carrier channel), 114 (e.g., 3 MHz carrier channel), 116 (e.g., 1.4 MHz carrier channel) and 118 (e.g., 3 MHz carrier channel).

The satellite eNB 130 is coupled to the satellite antenna 132 that communicates with the satellite 110 via a feederlink 140. In some aspects, the satellite eNB 130 is multi-cell (multi-beam) base station and may include among other components and modules a communication processor. In some implementations, the communication processor is a specialized processor that is configured to perform one or more functionalities of the satellite eNB 130 with respect to the subject disclosure. In some aspects, the satellite system of the environment 100 is a power limited multi-beam satellite system and the subject technology discloses per LTE sub-frame RB threshold management to enable the use of the LTE air interface in such a satellite system.

Using the widely deployed, field proven LTE physical layer in conjunction with its associated Layer 2 and 3 technologies can be very beneficial for satellite networks. Examples of these benefits include seamless support of EPC services to end users, interoperability with service provider core networks, a well-defined paradigm for resource management and the ability to leverage commercial-off-the-shelf (COTS) LTE technologies and products.

In the satellite LTE radio access network (RAN) topology as shown in FIG. 1, the eNodeB 130 transmits at least one downlink (DL) orthogonal frequency division multiple access (OFDMA) carrier paired with an uplink (U/L) single carrier-frequency division multiple access (SC-FDMA) carrier in each satellite beam (cell). The LTE carriers, as per the 3GPP specifications, can be configured for different bandwidths (depending upon traffic demands), with a minimum bandwidth of 1.4 MHz consistent with 3GPP standards. Preserving standard LTE carrier sizes and channel structure may increase reuse of LTE COTS products. The satellite LTE RAN incorporates a basic set of adaptations in areas such as not using hybrid automatic request for retransmission (HARQ) and modifying physical random access channel (PRACH) timing to accommodate larger delay variance. An important aspect of these adaptations is that they are implemented via small changes to software and firmware and allow COTS hardware to be used in an un-modified manner.

Deployment of a satellite LTE RAN in a multi-beam (e.g., >1 beam) satellite network, however, may encounter a number of significant challenges. A key challenge discussed herein is the ability to effectively work with satellite payload designs that employ shared power amplifiers (PAs) to amplify signals associated with LTE carriers being transmitted into multiple DL beams. Effective use of shared PAs relies on ensuring that the associated power transmitted by ground equipment is controlled such that these PAs together operate within the highest power draw (or current draw) from the satellite power source and that each PA operates within a configured output power backoff (OBO) to ensure linear amplification It is known that the minimum carrier size associated with the LTE physical layer is about 1.4 MHz, which implies that the corresponding spectrum (and associated power for signal amplification) needs to be available in every beam throughout the entire geographic area covered by the satellite. This requirement may be easily met if the satellites were to use beams that have a large geographic footprint (e.g., regional beams). Satellites, however, are being increasingly designed with small size high-gain spot beams that provide for greater reuse of frequency spectrum, support small-profile user terminals (like handhelds), or provide higher data rates to larger terminals. Using small beams translates to a need for a large number of beams to cover the geographical area served by the satellite. Given typical geographic distribution of users (terminals), a large number of these spot beams are usually lightly loaded (e.g., low traffic density) and as such only require a fraction of the resources provided by the 1.4 MHz carrier. Even so, to accommodate 3GPP LTE specification-compliant equipment, the system design must take into consideration the RF power needed to amplify the entire LTE carrier bandwidth. The same situation also occurs with larger carriers since they are defined to operate at specific bandwidths (e.g., 3 MHz, 5 MHz, 10 MHz, etc.) and as such cannot be fine-tuned for the anticipated loading in a beam. For instance, even if only 2 MHz of bandwidth is needed to support user traffic, the system has to use a 3 MHz carrier (since that is the next larger carrier size after 1.4 MHz).

A satellite LTE design is thus significantly restricted by the number of beams (cells) that can be served with the available RF power given the requirement to support only the standardized LTE carrier bandwidth (1.4 MHz, 3 MHz, etc.) in each cell. As a matter of contrast, schemes such as multi frequency-time division multiple access (MF-TDMA) which use smaller size carriers (e.g., 200 KHz) are able to easily support a larger number of beams, since the allocated frequency (and corresponding power) can more closely match user capacity requirements in each beam.

A related constraint is that per-beam traffic requirements are time-variant given the wide array of user applications and usage patterns. Accommodating traffic variations also becomes difficult in a multi-beam satellite LTE network, while this can be easily accomplished within a scheme such as MF-TDMA where additional carriers (e.g., 200 KHz) can be dynamically allocated or de-allocated to a beam depending upon user traffic requirements.

The introduction of narrowband LTE (NB LTE) 200 KHz carrier type in Release 13 alleviates the RF power constraint to some extent and enables larger number of beams to be used. However the stated problem may still be of concern as a typical satellite LTE network can consist of a combination of regular LTE and narrowband LTE carriers.

The subject technology leverages the LTE physical layer time-frequency resource grid structure and enables the deployment of multi-beam satellite LTE networks by introducing the concept of time-based resource thresholding, in the LTE time-frequency resource grid structure.

The LTE resource grid structure in the time dimension is based on an approximately 10 msec frame with each frame consisting of ten subframes that are approximately 1 msec in duration. Each subframe further consists of two approximately 0.5 msec time-slots. A time-slot consists of 7 symbols in normal cyclic prefix (CP) mode, with each symbol carrying control signaling or user traffic. In the frequency dimension, a time-slot consists of multiple Resource Blocks (RBs) each of which consists of 12 consecutive sub-carriers of 180 kHz. The number of RBs in a time-slot depends upon the size of the LTE carrier. For instance, there are 6 RBs in the 1.4 MHz carrier (e.g., usable bandwidth (BW) of 6×180 kHz or 1.08 MHz), and 15 RBs in a 3 MHz carrier (e.g., usable bandwidth of 15×180 kHz or 2.5 MHz). The RBs represent assignable units of resource allocation (e.g., bandwidth & time) for traffic to and/or from users. The total information bits that can be transported in an RB depend upon the modulation and coding used and percentage of the RB that is set aside for system overhead functions (e.g., reference and/or pilot, synchronization, system information, resource assignment, etc.).

Figure 2A:
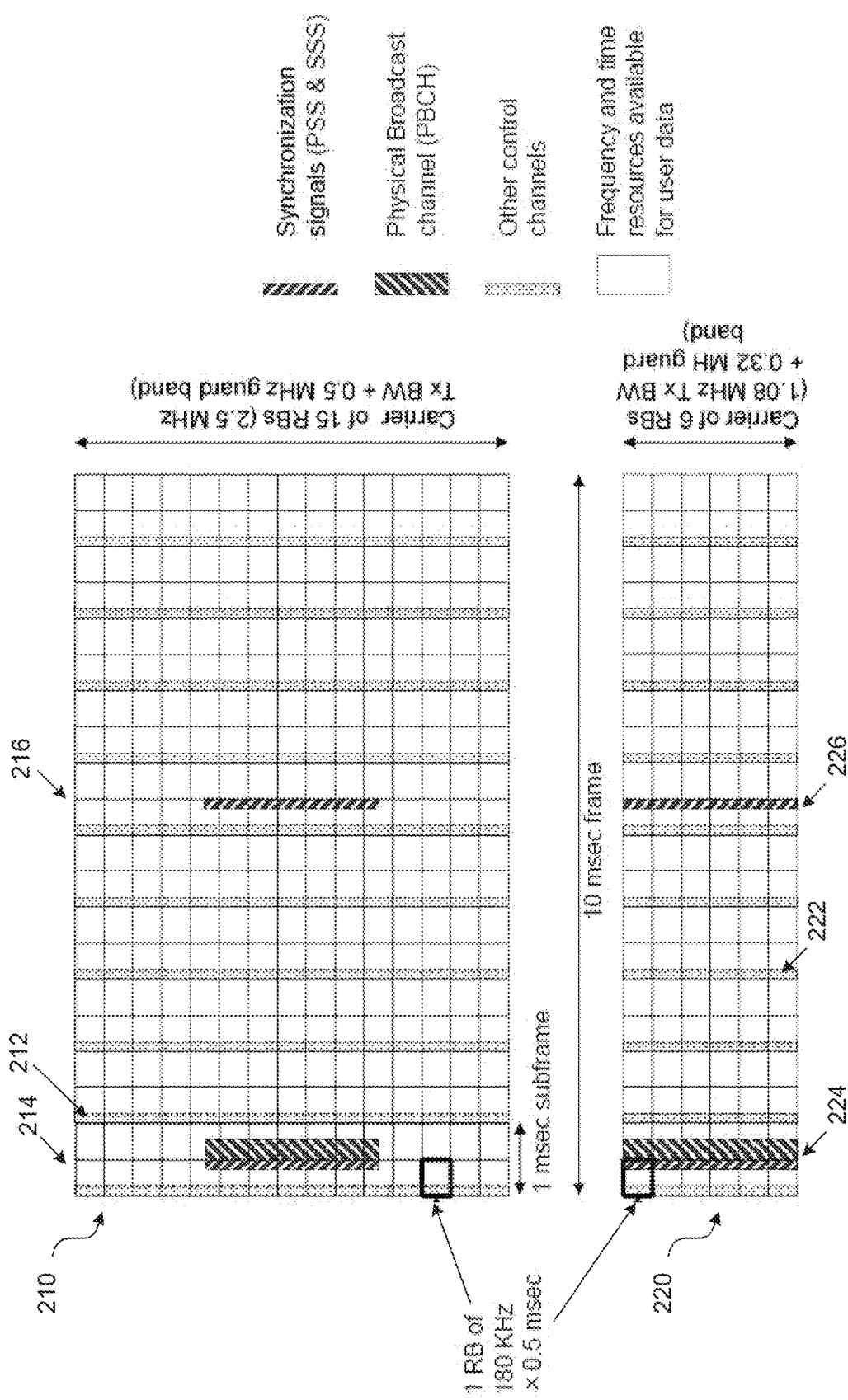
FIGS. 2A-2B are diagrams illustrating an example of an LTE frequency-time resource grid and a resource block (RB) scheme based on LTE specification.
Figure 2B:
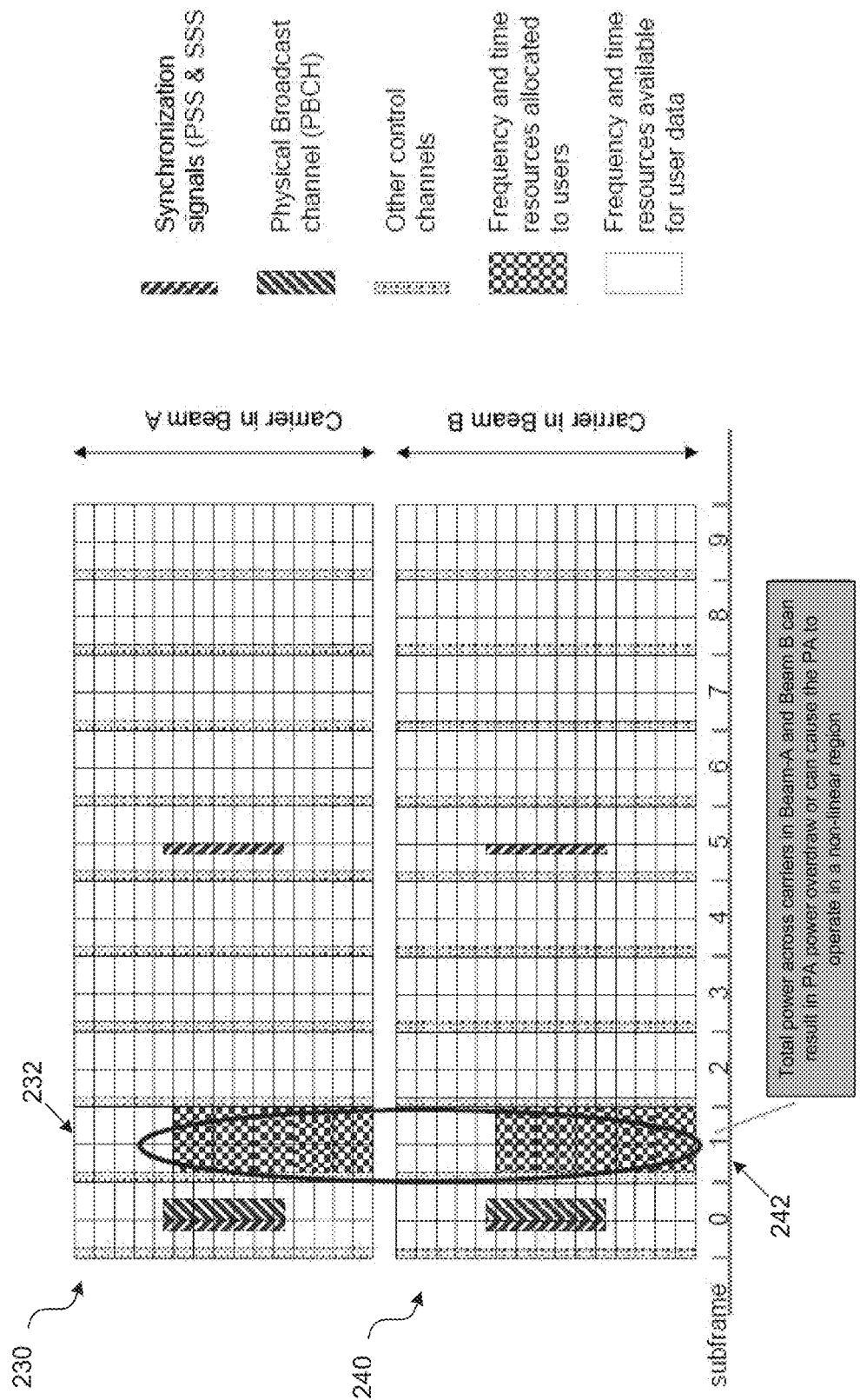

FIGS. 2A-2B are diagrams illustrating an example of an LTE frequency-time resource grid and a resource block (RB) allocation scheme 210 and 220 based on LTE specification. FIG. 2A illustrates the DL (e.g., from the eNodeB 130 to the UE 120 of FIG. 1) LTE frequency-time resource grids 210 for the 3 MHz carrier and 220 the 1.4 MHz carrier. The LTE frequency-time resource grids 210 and 220 include control channels 212 and 222 at the beginning of each subframe. Subframes 214 and 224 include shaded areas depicting synchronization signals such as primary synchronization signal (PSS) and secondary synchronization signal (SSS) and physical broadcast channels (PBCHs), and subframes 216 and 226 include shaded areas depicting synchronization signals. Example RBs of 180 KHz over a 0.5 msec slot are also shown in FIGS. 2A and 2B. The un-dashed (white) areas of the resource grids 210 and 220 are available for user data.

FIG. 2B illustrates a DL LTE frequency-time resource grid 230 for carriers in a beam A (e.g., including 3 MHz carrier channels) and a resource grid 240 for a beam B (e.g., including 3 MHz carrier channels). These resource grids 230 and 240 are similar to the resource grids 210 FIG. 2A, except that in subframes 232 and 242, a number of RBs of the beam A and beam B are allocated to users. In this example resource allocation, it is assumed that the two carriers are being amplified by a common on-board PA that has a preset linear amplification power draw limit corresponding to a max of about 15 RBs. As shown in FIG. 2B, each cell (beam) has traffic that is equivalent to 10 RB pairs which are allocated in subframes 232 and 242. An issue with the shown power allocation in FIG. 2B is that the total allocation of 20 RB pairs across the two carriers causes the on-board PA to exceed its power draw limit of 15 RBs. The same condition may arise if separate PAs are used, but there is a limit on the total power available to them. The subject technology addresses this issue as shown and discussed with respect to FIGS. 3A and 3B and the algorithm of FIG. 4.

Figure 3A:
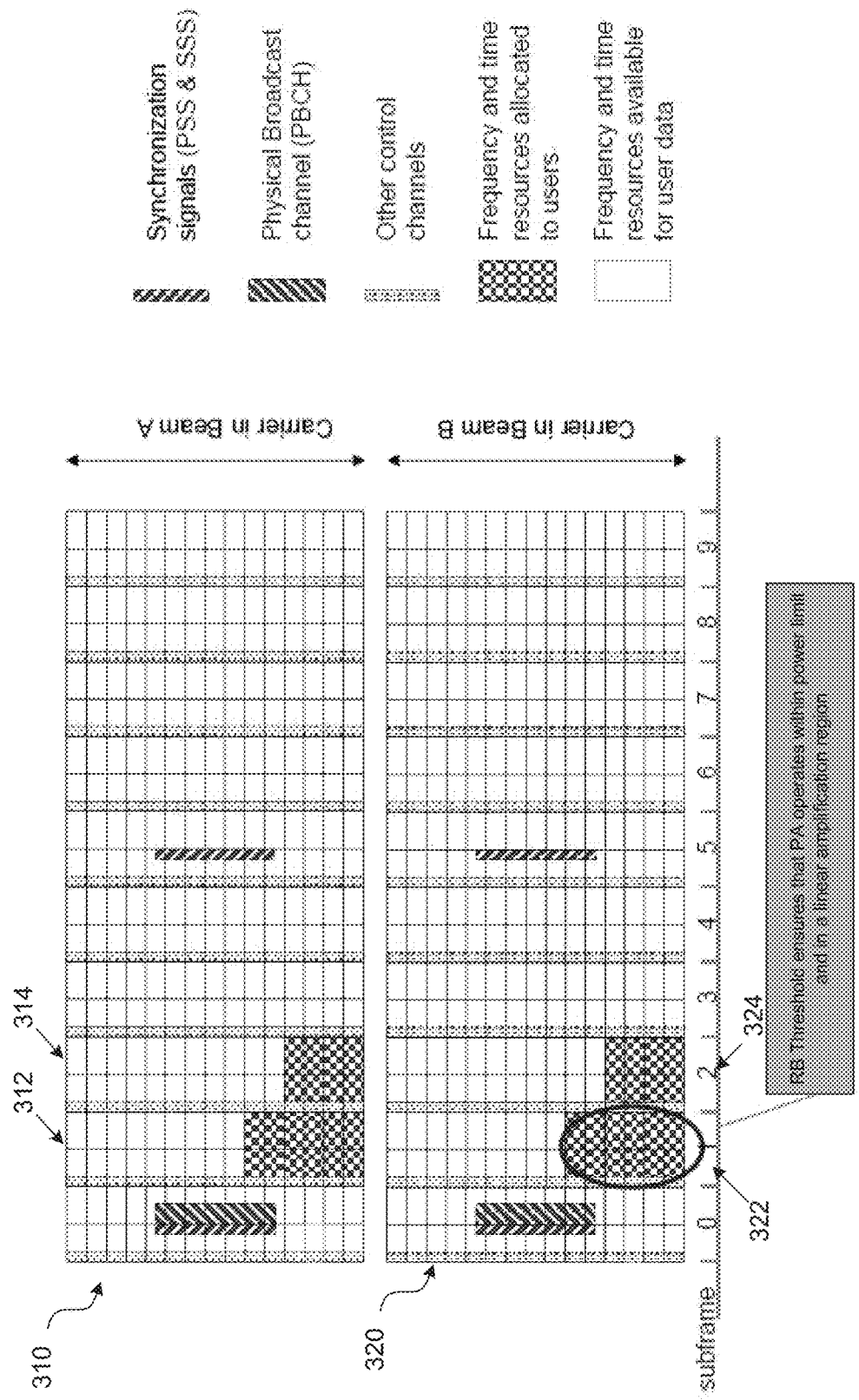
FIGS. 3A-3B are diagrams illustrating examples of RB allocation schemes based on RB threshold, according to certain aspects of the disclosure.
Figure 3B:
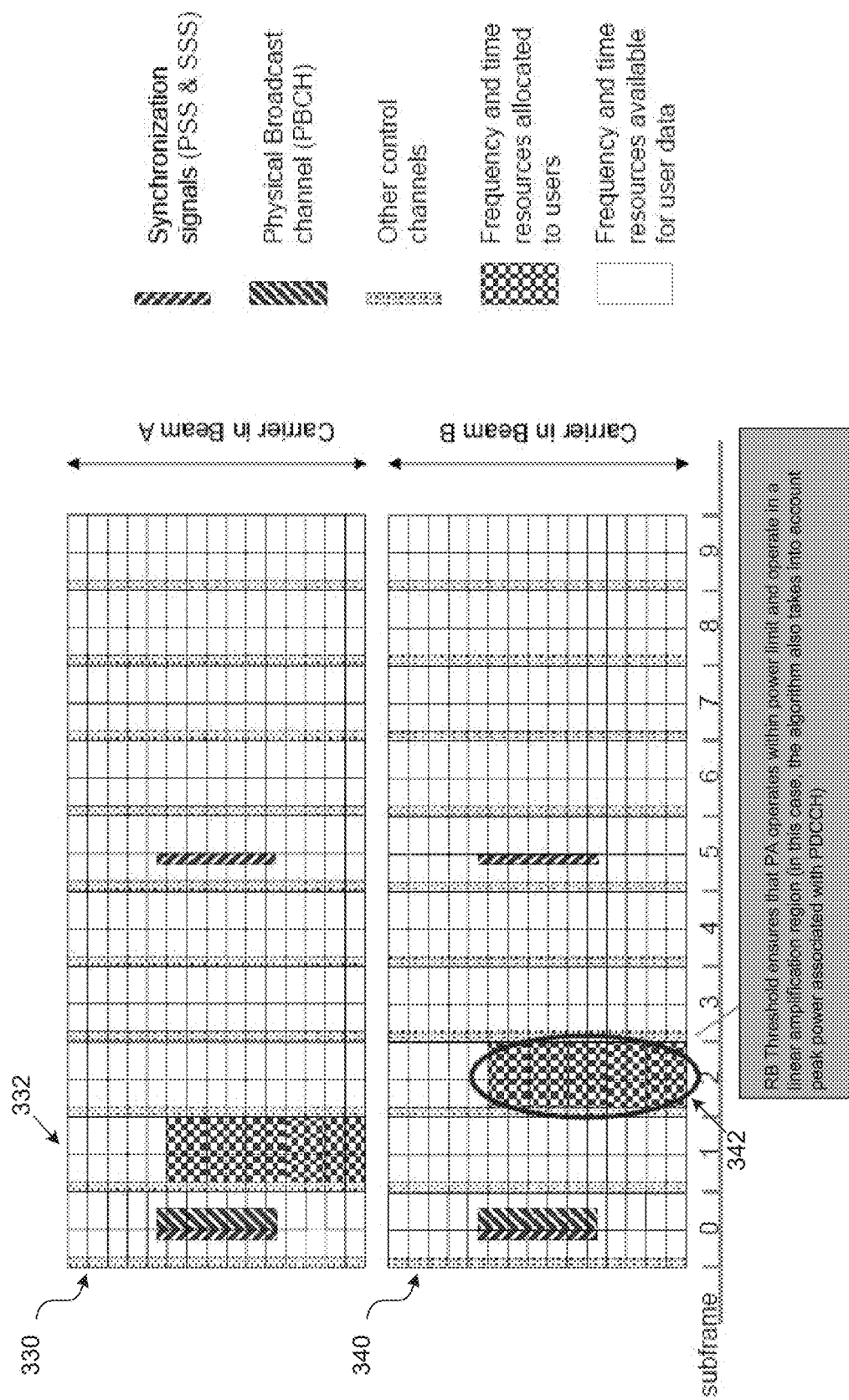

FIGS. 3A-3B are diagrams illustrating examples of RB allocation schemes 310, 320, 330 and 340 based on RB threshold, according to certain aspects of the disclosure. The resource allocation scheme 310 and 320 shown in FIG. 3A are for the carriers in beams A and B, respectively, and are depicted on a resource grid similar to the resource grid 210 of FIG. 2A. The resource allocations in schemes 310 and 320 are based on the disclosed RB threshold method and ensure that the PA operates within the corresponding power limit and the allocated RBs are constrained to be allocated on a per subframe basis. The total amount of channel bandwidth resource allocated for each beam A and B is the same as in FIG. 2B, but is distributed between second and third subframes 312 and 314 in the scheme 310 and second and third subframes 322 and 324 in the scheme 320, thereby ensuring that the on-board PA power draw stays within the predefined budget The RB threshold method achieves the same objective even if the LTE carriers are on separate PAs, but there is a limit on the total power available to them.

The resource allocation scheme 330 and 340 shown in FIG. 3B are for the carriers in beams A and B, respectively. The resource allocations in schemes 330 and 340 are based on the disclosed RB threshold method and ensure that the PAs operates within the corresponding power limit. In these cases, the RB threshold algorithm takes into account peak power associated with the physical downlink control channel (PDCCH). A total amount of channel bandwidth resource allocated for both beams A and B is the same as in FIG. 2B, but is distributed between second subframe 332 of the scheme 330 and the third subframe 342 of the scheme 340. In some aspects, the resource allocation scheme 330 and 340 are implemented by the communication processor of the eNodeB 130 of FIG. 1. The RB threshold method achieves the same objective even if the LTE carriers are on separate PAs, but there is a limit on the total power available to them.

In the DL direction, a scheduler at the eNodeB 130 is responsible for the dynamic allocation of the available RBs on a per subframe basis to user terminals (e.g., UE 120). The basic premise of the subject solution is that the number of RBs that can be allocated on a per-subframe basis for every LTE DL carrier is restricted by a threshold. The threshold, represented by the term SF_RB_THRESH, ensures that the power associated with the total input signals for all LTE carriers on a PA (or a group of shared PAs) is within the established power budget of the PA. The threshold also ensures that the aggregate power across all PAs is within the established power budget at the satellite level.

The value of SF_RB_THRESH for each subframe of a LTE DL carrier can be determined either statically based on the anticipated DL carrier traffic or dynamically based on the actual offered traffic in the system. One important constraint that must be satisfied is that the sum of SF_RB_THRESHs for all carriers for each subframe across all PAs does not exceed the parameter SAT_RB_THRESH which corresponds to the total available RF power at the satellite level. SAT_RB_THRESH is in unit of RBs, indicating the number of RBs across the satellite that can be supported. A second important constraint is PA_RB_THRESH which represents the maximum number of RBs that can be placed on one PA with the PA operating in the linear amplification region. PA_RB_THRESH is the power budget for a PA.

In the dynamic methodology, the following resource allocation weighting and priority guideline may be established through calculating a per-frame RB threshold (designated as RB_THRESH) for each DL carrier. The number of RB pairs allocated on a carrier in a frame should not exceed the corresponding RB_THRESH. First, it is to be ensured that the minimum bit rate (MBR) for admitted guaranteed bit rate (GBR) bearers is satisfied. Second, a fair-share approach may be followed regarding the remaining un-allocated RF power (in terms of RBs) across all the DL carriers based on the actual offered traffic. The computation for distribution of un-allocated power can take into account the modulation coding scheme (MCS) index applicable to the user traffic and thus allow for the prioritized treatment of traffic with higher MCS indices, which are more bandwidth efficient. The fair-share may also take into consideration the QoS class indicator (QCI) priorities as well as setting aside spare bandwidth (RBs) for new GBR calls. The computation of RB_THRESH may be performed every N Frames, with the value of N depending on the desired responsiveness to traffic and implementation considerations such as algorithm processing (e.g., CPU) capacity.

The actual offered traffic can vary in short-time scales (e.g., within N frames). Therefore, a recommended approach is to allow for the sum of RB_THRESH and SF_RB_THRESH across all carriers to be slightly larger (e.g., by about 10%) than the total aggregate power budget for all PAs at the satellite level. Thus, SAT_RB_THRESH may represent 110% of instantaneous satellite power budget for all the PAs. This allows for a better utilization of resources while relying on statistical variations in demand across all DL carriers to ensure that the total power drawn by the PAs is within budget and the PAs operate in the linear amplification region Once the RB_THRESH is computed, statically or dynamically, then SF_RB_THRESH is calculated for each of the 10 subframes for each DL carrier. This computation takes into consideration the RB_THRESH, which reflects proportional user traffic demand for each DL carrier. The SF_RB_THRESH parameter (with 10 values, 1 per subframe) is provided to each DL scheduler and used as a constraint when allocating RBs for user traffic. With the proposed method, the DL scheduler (one per DL LTE carrier) is responsible for autonomously allocating RBs, with SF_RB_THRESH on a per subframe basis ensuring that the total power across all LTE DL carriers stays within the predefined budget and that each PA operates in the linear amplification region.

The LTE specifications also define specific requirements to transmit synchronization, broadcast, and downlink control channels. These requirements also need to be considered by the SF_RB_THRESH computation algorithm. Regarding the downlink control channels (e.g., 212 and 222 of FIG. 2A), at the start of every subframe, a fraction of time of the whole carrier is dedicated to the PDCCH and the physical control format indicator channel (PCFICH), as well as the physical hybrid-ARQ indicator channel (PHICH). As previously noted, Hybrid ARQ is not used within the satellite LTE network and as such PHICH is not used. The PCFICH occupies only a small subset of the carrier BW (e.g., about 1.3 RB for one symbol) and as such its impact on power usage is not a primary driver. On the other hand, accommodating PDCCH is a driving criterion for the SF_RB_THRESH calculation. The PDCCH is transmitted only if there is user traffic to schedule within a subframe, but when transmitted, the PDCCH does require power to amplify all RBs of the carrier for about 14% of the subframe. In the example shown in FIG. 3A, it is assumed that the PA power draw threshold (PA_RB_THRESH) applies on an average basis over a period of one subframe (1 msec). As such, it is assumed in that example, that the presence of PDCCH across the entire 15 RB carrier for a short duration does not significantly change the average power usage in a subframe.

Regarding the synchronization and broadcast channels, in subframes 0 and 5 (e.g., 214 and 216 of FIG. 2A), six RB equivalent bandwidth (and power) at the center of an LTE carrier is used for the PSS and the SSS about 14% of subframe time. Also, the PBCH occupies same amount of bandwidth (and power) in subframe 0 (e.g., 214 of FIG. 2A), for about 29% of subframe time.

Figure 4:
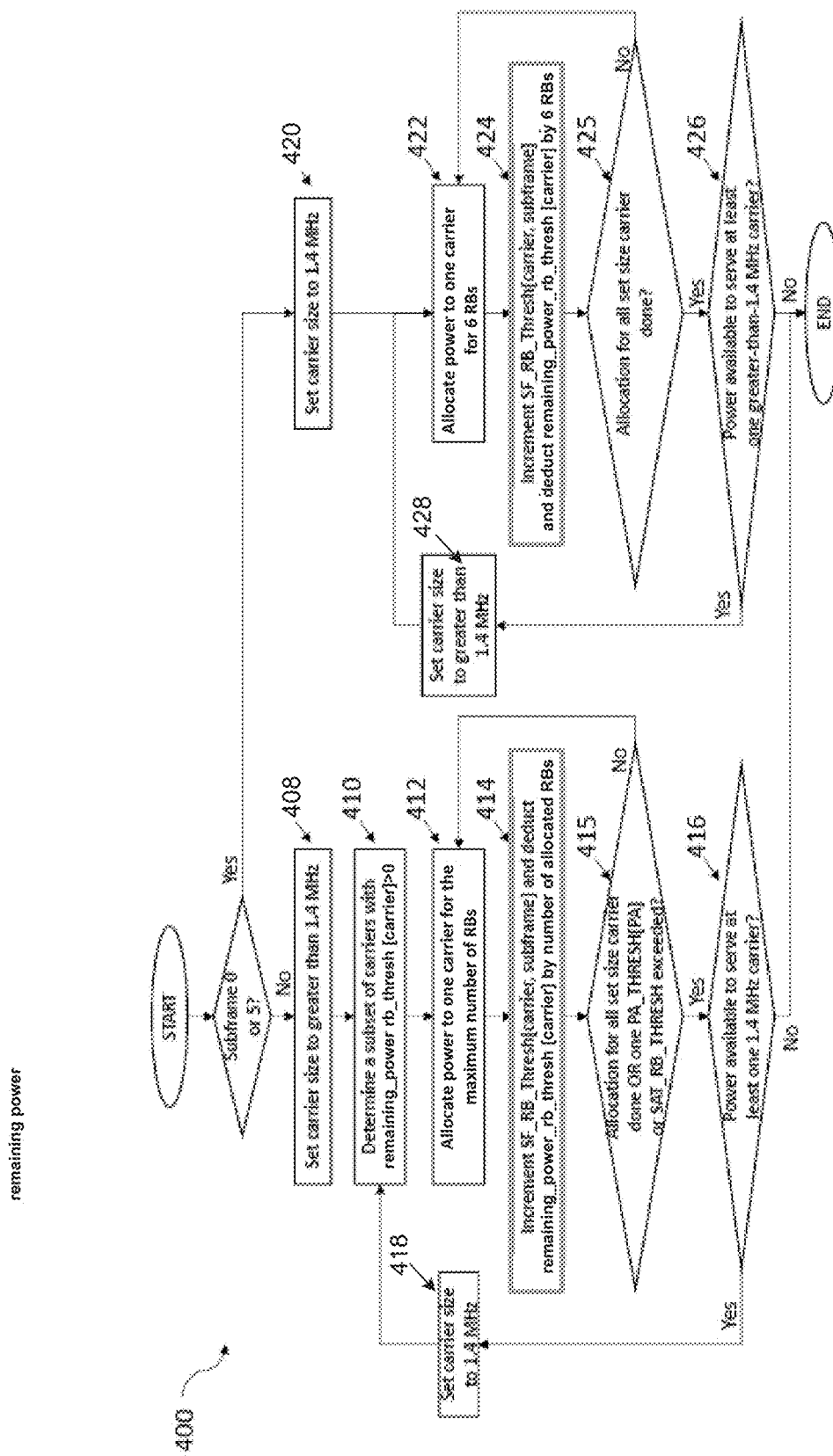
FIG. 4 is a flow diagram illustrating an example algorithm for RB threshold calculation, according to certain aspects of the disclosure.

The SF_RB_THRESH calculation algorithm hence needs to take into consideration the requirements for the transmission of the broadcast, control and synchronization channels in addition to user traffic transmission. An example SF_RB_THRESH calculation algorithm is shown in FIG. 4 and discussed below. As depicted, the algorithm updates two variables SF_RB_THRESH[carrier, subframe] and remaining_power_rb_thresh[carrier]. The first variable is the output of the algorithm and represents SF_RB_TRESH discussed so far for each carrier and each subframe of a frame. That is for any carrier, there are 10 values of SF_RB_THRESH. SF_RB_THRESH[carrier, subframe] is initialized to 0 and incremented through the algorithm. SF_RB_THRESH calculation algorithm iterates 10 consecutive times to generate SF_RB_THRESH [carrier, subframe] for each of subframe 0, 1, 2, 3 . . . and 9 of a frame. Before the 10 iterations, the second variable, remaining_power_rb_thresh[carrier], is initialized for each carrier, to the corresponding RB_THRESH value of the carrier. remaining_power_rb_thresh[carrier] represents the remaining power to allocate for a carrier over the course of the SF_RB_THRESH calculation algorithm for a frame. When remaining_power_rb_thresh[carrier] reaches 0, no more power can be allocated to the carrier in the remaining subframes of a frame.

FIG. 4 is a flow diagram illustrating an example algorithm 400 for RB threshold calculation, according to certain aspects of the disclosure. The algorithm 400 can be used for resource allocation to individual subframes (i.e., 0, 1, 2, 3, 4, 5, 6, 7, 8, or 9). The algorithm 400 starts with determining whether the subframe for which power allocation is to be performed is one of subframes 1, 2, 3, 4, 6, 7, 8, or 9, in which case the control is passed to operation block 408. Otherwise if the subframe under consideration is one of subframes 0 or 5 the control is passed to operation block 420.

At operation block 408 the carrier frequency value is set to greater than 1.4 MHz. At operation block 410, a subset of carriers that are greater than 1.4 MHz in bandwidth and have non-zero (e.g., power still to be allocated) remaining_power_rb_thresh [carrier] for the subframe are determined. At operation block 412, power corresponding to the maximum number of RBs suitable for (e.g., equal to) the size of the carrier, for example, 15 RBs worth of power for a 3 MHz size carrier, is allocated to each such carrier. At operation block 414, the SF_RB_THRESH [carrier, subframe] is incremented and the remaining_power_rb_thresh[carrier] is deducted by the number of RBs to account for the power that is allocated. At control operation block 415 it is made sure that power allocation across all set carriers is complete or one PA_THRESH[PA] or SAT_RB_THRESH is exceeded for the subframe. If the answer is no, then the control is passed to the operation block 412. Otherwise, the process is continued and, at operation block 416, determination is made whether there is still available power to serve at least one 1.4 MHz carrier, that is, whether sum of SF_RB_THRESH across all the allocated carriers in the subframe is less than PA_RB_THRESH by at least 6 RBs. If there is available power to serve at least one 1.4 MHz carrier, at operation block 418, the carrier size value is set to 1.4 MHz and the control is passed to the operation block 410. However, if there is no available power to serve at least one 1.4 MHz carrier, the process ends.

At operation block 420, for each of subframes 0 and 5 the carrier channel frequency is set to 1.4 MHz. At operation block 422, power for 6 RBs is allocated to each 1.4 MHz carrier. At operation block 424, the SF_RB_THRESH[carrier, subframe] is incremented and 6 RBs are deducted from the remaing_power_rb_thresh[carrier]. At control operation block 425 it is checked to ensure that allocation for all set carriers is complete. If power allocation is not complete, the control is passed to the operation block 422. Otherwise, if the power allocation is complete, at control operation block 426 it is determined whether power is available to serve at least one greater-than-1.4 MHz carrier. If the power is available, at operation block 428, the carrier size is set to be greater than 1.4 MHz and the control is passed to the operation block 422. Otherwise if the power is not available, the process ends.

The algorithm 400 discussed above allocates power to each carrier on a per-subframe basis for simplicity, computational efficiency, and effectiveness. This is in contrast to allocating power on a per LTE OFDMA symbol (e.g., about 71 µsec for normal CP) basis. For a subframe with no PSS, SSS, or PBCH, a carrier is allocated power for all RBs of the carrier or none, to be power efficient in accounting for the fact that PDCCH needs all RBs of the carrier to transmit when there is traffic to schedule; priority is given to carriers greater than 1.4 MHz in size, because the 1.4 MHz carriers may transmit traffic in subframes 0 and 5 without incurring additional power.

Note that in the operation block 424, the SF_RB_THRESH allocation to the 1.4 MHz carriers takes into consideration the fact that PSS, SSS, and PBCH are to be transmitted on those carriers regardless of presence of user traffic. The SF_RB_THRESH algorithm does take into account the fact that RBs that contain SSS, PSS and PBCH channels transport fewer traffic bits as compared to traffic only RBs.

An example of the operation blocks 410, 412, 414, and 415 is the RB power allocation as shown in FIG. 3B and discussed above, where power for RBs is allocated in adjacent subframes across two carriers to account for PDCCH transmission while fulfilling the same offered traffic load shown in FIG. 2B. This is in contrast to FIG. 3A, in which the PDCCH transmission was not considered.

If the total power threshold PA_RB_THRESH is inadequate to support simultaneous PSS, SSS, and BPCH transmission across all LTE carriers in subframes 0 and 5, then some changes to the LTE standard will be needed. For example, the PSS/SSS/PBCH transmission schedule may be changed from once every frame on every carrier in the LTE standard, to a repeating pattern of once in each of four consecutive frames and followed by none in four consecutive frames for every carrier; and in a particular frame, only half of all the carriers are scheduled to transmit PSS, SSS, and PBCH. With this change, the amount of power needed for transmitting PSS, SSS, and PBCH is reduced to half, at the expense of slightly prolonging the time needed for a terminal to perform acquisition and beam reselection. The reason to use a 4-frame-on-and-4-frame-off pattern, instead of on-every-other-frame, is that LTE PBCH has a 4-frame repetition cycle for which the same system information is transmitted in four consecutive frames, but with different encoding, to enhance the robustness of the channel. The SF_RB_THRESH algorithm in operation blocks starting from 420 can easily accommodate such changes.

The SF_RB_THRESH algorithm 400 can also accommodate configurations where the frame boundaries of LTE carriers are shifted in integral increments of subframes to minimize the control channel (e.g., PSS, SSS, and PBCH) overlap. Further, the algorithm 400 can accommodate NB LTE carriers by taking into account the longer frame and subframe cycles. With an NB LTE carrier, the per SF_RB_THRESH is either 0 or 1 (because there is only one RB per carrier). At operation block 415, determination is made whether the per-PA budget is exceeded or not, based on the satellite payload design. There are different satellite payload designs for feeding carriers to PAs for amplification and eventual transmission towards ground. The carrier to PA mapping may be generally modeled as three matrices as shown FIG. 7A and discussed below.

In some implementations, the algorithm 400 can be implemented by processing resources of an eNodeB (e.g., 130 of FIG. 1).

Figure 5:
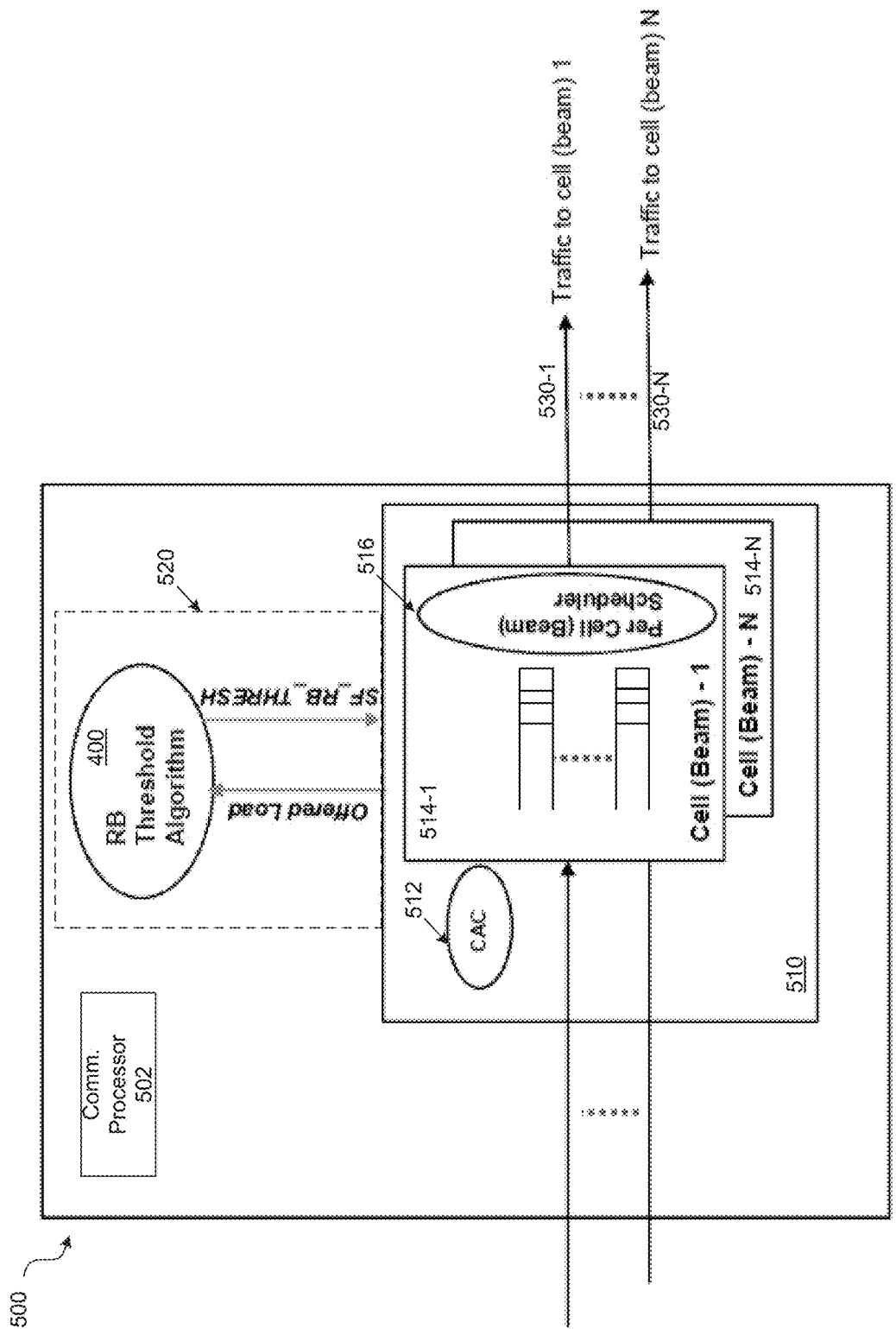
FIG. 5 is a diagram illustrating an example system for performing the RB threshold calculation algorithm in the context of per-LTE carriers D/L schedulers at a satellite eNodeB, according to certain aspects of the disclosure.

FIG. 5 is a diagram illustrating an example system 500 for performing the RB threshold allocation algorithm 400 of FIG. 4 at a satellite eNodeB, according to certain aspects of the disclosure. The system 500 depicts the overall context, at a satellite eNodeB (e.g., 130 of FIG. 1), of a dynamic RB threshold management algorithm such as the algorithm 400. It is to be understood that the eNodeB depiction is logical and its implementation can be manifested into multiple physical eNodeBs. In this scenario, one of the eNodeBs (or a central network control center) can implement the SF_RB_THRESH algorithm 400 by interacting with all of the eNodeB s.

In some implementations, the system 500 includes, among other components and modules, a communication processor 502 and a portion 520 added to a MAC layer 510 of an eNodeB. In some implementations, the communication processor 502 is a specialized processor that is configured to perform one or more functionalities of the satellite eNodeB with respect to the subject disclosure. The MAC layer 510 may include a call admission control module 512 and a number of schedulers 516, each scheduler being associated to an LTE carrier in a cell (beam) 514 (e.g., 514-1 to 514-N). The portion 520 includes the RB threshold allocation algorithm 400. The algorithm 400 receives offered load (e.g., the actual offered traffic) from the MAC layer 510 and provides values for SF_RB_THRESH to the MAC layer 510, as discussed above with respect to FIG. 5. In some implementations, the algorithm 400 can be implemented by the communication processor 502 or any other processor. The schedulers 516 provide traffic 530 (e.g., 530-1 to 530-N) for cells (beams) 514 (e.g., 514-1 to 514-N), based on the values for SF_RB_THRESH provides by the algorithm 400.

FIGS. 6A and 6B illustrate matrices representing carrier-to-amplifier mapping and an example calculation of power load on an amplifier. In FIG. 6A, matrix A represents a weighted beam-to-PA mapping, showing the beams that each amplifier amplifies and the input weighting of each beam for the amplifier. There are M amplifiers and N beams. The rows represent PAs and columns represent beams. For example, signals to beam 1 are weighted by coefficients $a_{11}$, $a_{21}$, . . . , $a_{M1}$, respectively, before being fed to $PA_1$, $PA_2$ . . . and $PA_M$, respectively, for amplification. The input weighting coefficients in each column are generally non-zero for more than one row, for the purpose of, for example, beam forming. But in a simpler case of $a_{11}=1$, $a_{21}=0$, . . . , $a_{M1}=0$, signals to beam 1 are amplified solely by $PA_1$. Matrix B represents carrier-to-beam mapping that indicates carriers used in each beam. There are N beams and P carriers. In any column k of matrix B, only one row j entry is 1 and all other entries are 0, representing that the carrier k is used in beam j.

In FIG. 6A, matrix C is the matrix product of the matrix A and the matrix B. Each row of the matrix C shows the carriers amplified by one amplifier and the input weighting coefficients of the carriers for the amplifier. In determining whether power for a certain number of RBs can be allocated on a particular carrier in a particular subframe, the rows of matrix C can be used to calculate the impact on each of the PAs, that is, whether PA_RB_THRESH is exceeded at each PA.

FIG. 6B provides a notional but concrete example to calculate the power on a PA. Matrix A shows 4 beams mapped to 3 amplifiers, where beam 1 and beam 2 share amplifiers 1 and 2, and beam 3 and beam 4 share amplifier 3. Matrix B shows there are respectively 2, 2, 1, and 1 carrier on each of the 4 beams. If, for example, power for 15, 6, 6, 15, 6, and 15 RBs is respectively allocated on each of the 6 carriers for a particular subframe. Then on amplifier 1, the total power would be 15*0.6+6*0.6+6*0.4+15*0.4+15*0+ 6*0=21 RBs worth for the subframe. If the value 21 exceeds PA_RB_THRESH, then some of the carriers cannot be allocated as many RBs in the specific subframe. Check needs to be performed for all amplifiers.

In allocating power for RBs to a set of carriers per traffic demand, if power on an amplifier exceeds PA_RB_THRESH, or aggregate power on all amplifiers exceeds SAT_RB_THRESH, then not all carriers can be allocated power corresponding to the number of RBs per traffic demand. Optimization may be performed to determine the subset of carriers to be allocated RBs to, for example, maximize the number of RBs that can be allocated across the carriers. Such optimization on choosing the best subset of carriers is an implementation detail. A simple way to choose carriers is to create a priority ranking among the carriers. Then carriers are allocated power for RBs from high priority to low priority, until either PA_RB_THRESH is exceeded on an amplifier or SAT_RB_THRESH is exceeded across all amplifiers.

Figure 7:
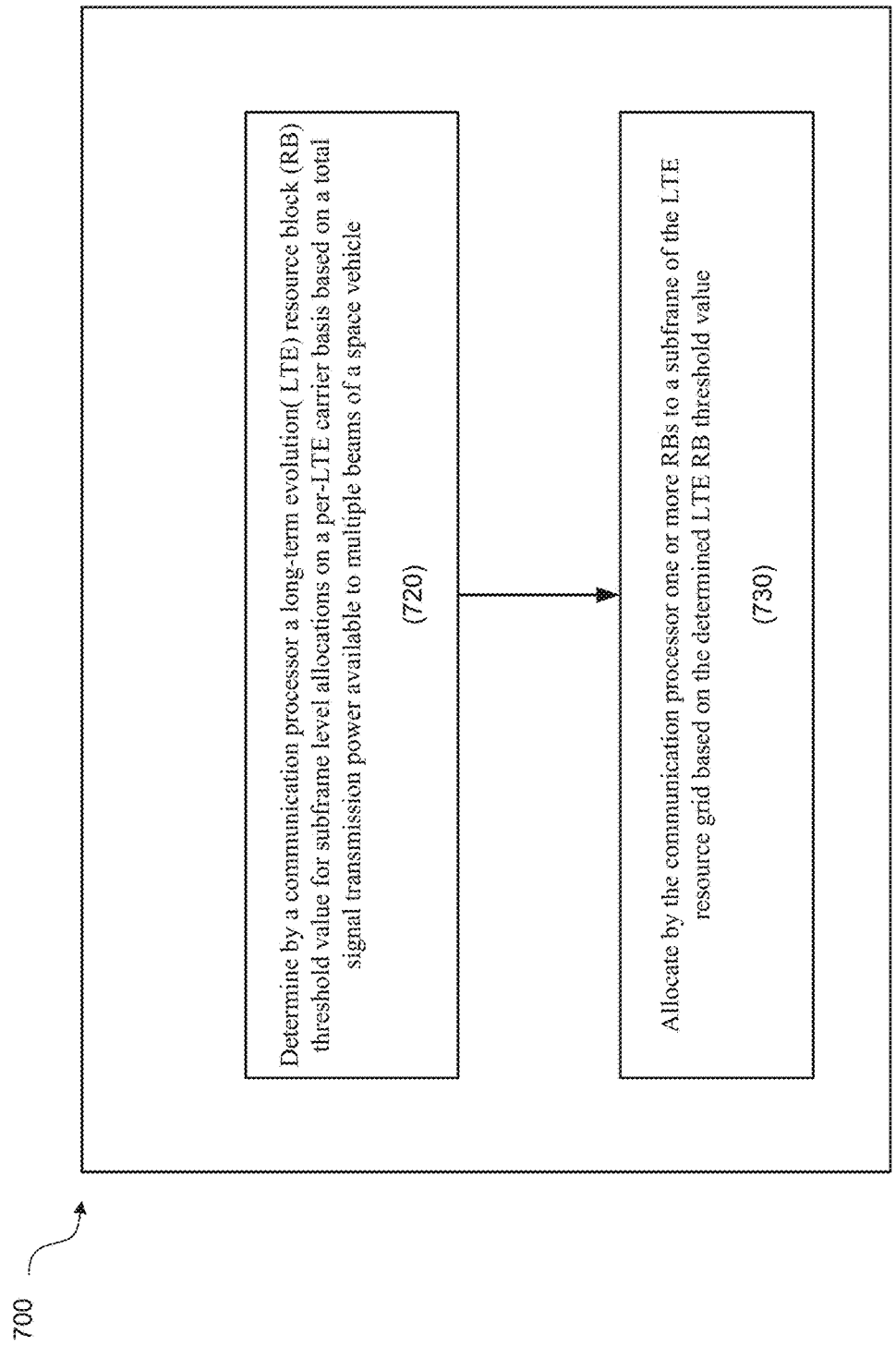
FIG. 7 is a flow diagram illustrating an example relationship between the RB threshold determination algorithm and the D/L LTE schedulers, according to certain aspects of the disclosure.
Figure 8:
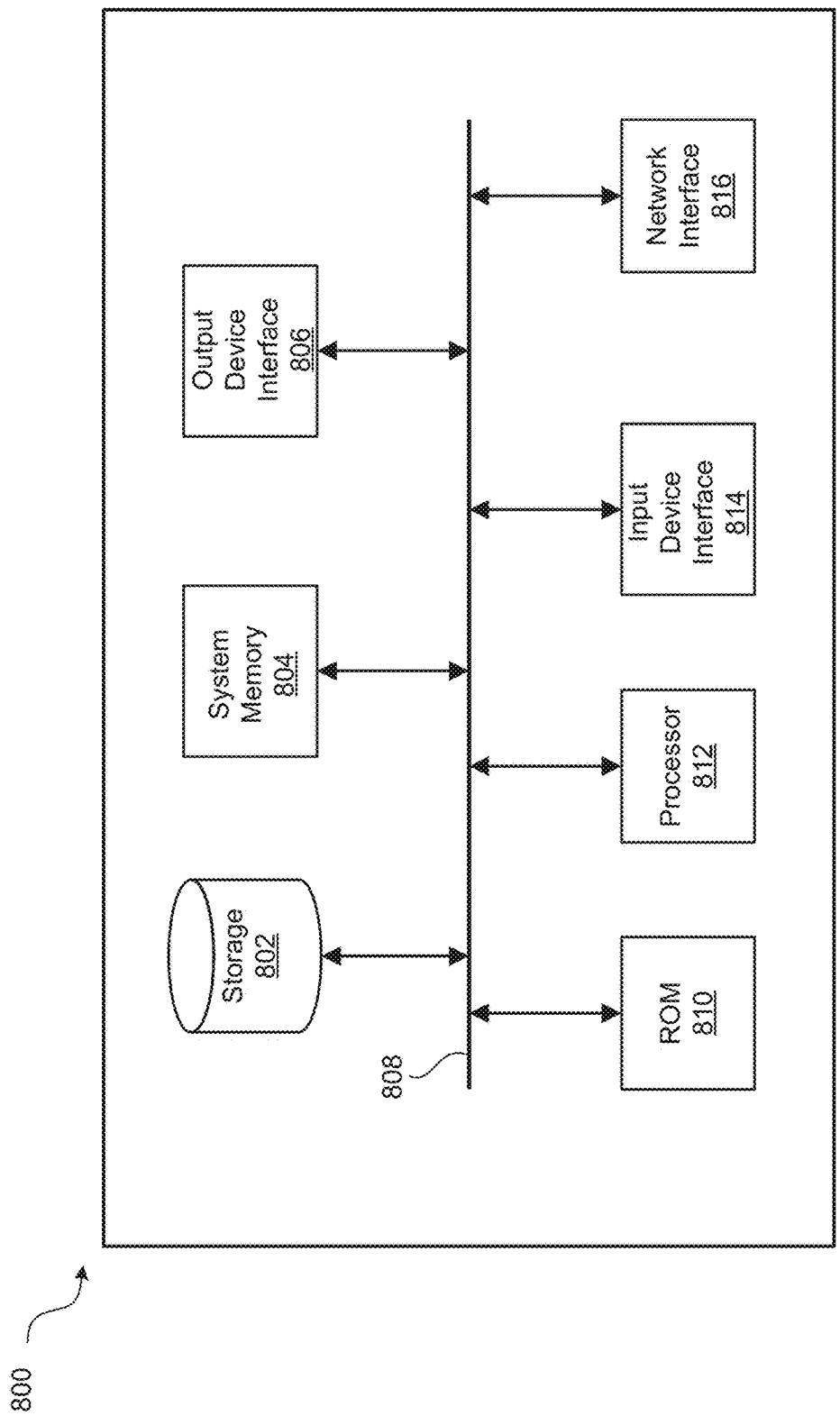
FIG. 8 is a block diagram conceptually illustrating an electronic system with which aspects of the subject technology are implemented.

FIG. 7 is a flow diagram illustrating an example method 700 of hierarchical resource allocation in a multi-beam LTE satellite network, according to certain aspects of the disclosure. The method 700 includes determining by a communication processor (e.g., 502 of FIG. 5) a resource block (RB) threshold (maximum) value for a per LTE carrier, subframe level resource allocations corresponding to an LTE resource grid (210 and 220 of FIG. 2A) based on a total transmission power available to multiple beams of a space vehicle (720). The LTE downlink scheduler within the communication processor then allocates one or more RBs (e.g., as shown in FIG. 3A) to a subframe of the LTE resource grid based on actual traffic demand and subject to the maximum determined RB threshold value (730). FIG. 8 is a block diagram conceptually illustrating an electronic system 800 with which aspects of the subject technology are implemented. Electronic system 800, for example, can be a desktop computer, a laptop computer, a tablet computer, a server, a switch, a router, a base station, a receiver, a phone, a personal digital assistant (PDA), or generally any electronic device that has processing power and memory and communication capability. Such an electronic system may include various types of computer readable media and interfaces for various other types of computer readable media. In some implementations, the electronic system 800 can represent the UE 120 of FIG. 1. The electronic system 800 includes bus 808, processing unit(s) 812, system memory 804, read-only memory (ROM) 810, permanent storage device 802, input device interface 814, output device interface 806, and network interface 816, or subsets and variations thereof.

Bus 808 collectively represents all system, peripheral, and chipset buses that communicatively connect the numerous internal devices of electronic system 800. In one or more implementations, bus 808 communicatively connects processing unit(s) 812 with ROM 810, system memory 804, and permanent storage device 802. From these various memory units, processing unit(s) 812 retrieves instructions to execute and data to process in order to execute the processes of the subject disclosure. The processing unit(s) 812 can be a single processor or a multi-core processor in different implementations. In some implementations, the processing unit(s) 812 can be the communication processor of a base station such as a satellite eNodeB (eNB) and perform some of the functionalities discussed above with respect to the algorithm 400 of FIG. 4 or the method 600 of FIG. 6.

ROM 810 stores static data and instructions that are needed by processing unit(s) 812 and other modules of the electronic system. Permanent storage device 802, on the other hand, is a read-and-write memory device. This device is a non-volatile memory unit that stores instructions and data even when electronic system 800 is off. One or more implementations of the subject disclosure use a mass-storage device (such as a magnetic or optical disk and its corresponding disk drive) as permanent storage device 802.

Other implementations use a removable storage device (such as a floppy disk, flash drive, and its corresponding disk drive) as permanent storage device 802. Like permanent storage device 802, system memory 804 is a read-and-write memory device. However, unlike storage device 802, system memory 804 is a volatile read-and-write memory, such as random access memory. System memory 804 stores any of the instructions and data that processing unit(s) 812 needs at runtime. In one or more implementations, the processes of the subject disclosure are stored in system memory 804, permanent storage device 802, and/or ROM 810. From these various memory units, processing unit(s) 812 retrieves instructions to execute and data to process in order to execute the processes of one or more implementations.

Bus 808 also connects to input and output device interfaces 814 and 806. Input device interface 814 enables a user to communicate information and select commands to the electronic system. Input devices used with input device interface 814 include, for example, alphanumeric keyboards and pointing devices (also called "cursor control devices"). Output device interface 806 enables, for example, the display of images generated by electronic system 800. Output devices used with output device interface 806 include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 8, bus 808 also couples electronic system 800 to a network (not shown) through network interface 816. In this manner, the computer can be a part of a network of computers (such as a local area network ("LAN"), a wide area network ("WAN"), or an Intranet, or a network of networks, such as the Internet. Any or all components of electronic system 800 can be used in conjunction with the subject disclosure.

Many of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. Examples of computer readable media include, but are not limited to, RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable and/or rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. In one or more implementations, the computer readable media does not include carrier waves and electronic signals passing wirelessly or over wired connections, or any other ephemeral signals. For example, the computer readable media may be entirely restricted to tangible, physical objects that store information in a form that is readable by a computer. In one or more implementations, the computer readable media is non-transitory computer readable media, computer readable storage media, or non-transitory computer readable storage media.

In one or more implementations, a computer program product (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is:

1. A method for resource allocation in a multi-beam satellite long-term evolution (LTE) network, the method comprising:
   determining, by a communication processor of an enhanced Node-B (eNodeB), an LTE per subframe resource block (RB) threshold value that establishes the power for a highest number of RBs allocable within a subframe on a per-LTE carrier basis based on total power available to multiple beams of a space vehicle; and
   communicating the LTE per subframe RB threshold value to a downlink LTE scheduler function within the e Node-B to ensure that a count of subframe level RB allocations are less than the determined LTE per subframe RB threshold value,
   wherein establishing the power for the highest number of RBs is based on ensuring that power amplifiers operate in a linear amplification region.

2. The method of claim 1, wherein determination of the per subframe RB threshold value is based on the subframe number and carrier bandwidth size of each LTE carrier.

3. The method of claim 1, wherein determining the LTE per subframe RB threshold value is based on a static assumption of an anticipated traffic load in each LTE download (DL) carrier, and further comprising computing the LTE RB threshold value based on relative differences in traffic load.

4. The method of claim 1, wherein determining the LTE per subframe RB threshold value is based on ensuring that an aggregate minimum bit rate (MBR) of all admitted guaranteed bit rate (GBR) bearers in LTE carriers of each beam is satisfied.

5. The method of claim 1, wherein determining the LTE per subframe RB threshold value is based on differences between an offered short-term traffic and demand in LTE carriers in each beam.

6. The method of claim 1, wherein determining the LTE per subframe RB threshold value is based on a modulation coding scheme (MCS) index applicable to a user traffic in LTE carriers of different beams to allow for a prioritized allocation of LTE RB threshold values for more bandwidth efficient traffic with higher MCS indices.

7. The method of claim 1, wherein determining the LTE per subframe RB threshold is based on quality of service (QoS) class indicator (QCI) priorities of traffic in LTE carriers in different user beams and based on setting aside spare RBs for new GBR calls.

8. The method of claim 1, wherein determining the LTE per subframe RB threshold value is performed every N frames with a value of N depending upon a desired responsiveness to traffic and implementation considerations including algorithm processing.

9. The method of claim 1, wherein a sum of LTE per subframe RB threshold values is higher than an available power amplifier (PA) power to better utilize resources while relying on statistical variations in demand across all DL carriers.

10. The method of claim 9, wherein a carrier-to-amplifier mapping is used to determine whether allocating one or more RBs to a carrier causes at least one PA to exceed a corresponding power budget, wherein the corresponding power budget forces the amplifier to operate in a non-linear amplification region.

11. The method of claim 1, wherein determining the LTE per subframe RB threshold value is based on a power demand for amplifying physical downlink control channel (PDCCH) signals across all DL carriers.

12. The method of claim 1, wherein determining the LTE per subframe RB threshold value is distributed between multiple base stations sharing common satellite resources or is hosted in a centralized controller in communication with other base stations.

13. The method of claim 1, wherein determination of the LTE per subframe RB threshold value further depends on a number of RBs allocated to synchronization signals.

14. The method of claim 1, wherein determining the LTE per subframe RB threshold value further depends on a number of RBs allocated to physical broadcast channel (PBCH) messages.

15. The method of claim 1, wherein determining the LTE per subframe RB threshold value comprises limiting a number of RBs allocated in subframes 0 and 5 with a lowest LTE carrier frequency to 6 RBs.

16. The method of claim 1, wherein determining the per LTE per subframe RB threshold value comprises limiting a number of RBs allocated in subframes other than 0 and 5 to 6 RBs less than the LTE RB threshold value.

17. The method of claim 1, further comprising adapting a LTE standard for operation over satellite by shifting frame boundaries of LTE carriers in integral increments of subframes to minimize control channel overlap, related excessive power draw and a possibility of driving PAs into non-linear region of amplification, wherein the control channel comprises primary synchronization signal (PSS), secondary synchronization signal (SSS) and physical broadcast channel (PBCH).

18. The method of claim 17, wherein PSS, SSS, or PBCH transmission schedule is changed from once every frame on every LTE carrier to a repeating pattern, wherein the repeating pattern includes changing the PSS, SSS, or PBCH transmission schedule once in each of four consecutive frames.

19. A multi-beam satellite system for resource allocation in a long-term evolution (LTE) network, the system comprising:
a base station comprising a communication processor; and
one or more terminal devices configured to communicate with the base station,
wherein:
the communication processor is configured to:
determine an LTE per subframe resource block (RB) threshold value for subframe resource allocations on a per-LTE carrier basis based on total signal transmission power available to multiple beams of a space vehicle while ensuring that power amplifiers operate in a linear amplification region; and
communicating the LTE per subframe RB threshold value to a downlink LTE scheduler function within the e Node-B to ensure that a count of subframe level RB allocations is less than the determined LTE per subframe RB threshold value.

20. A method of adapting long-term evolution (LTE) over satellite, the method comprising:
shifting frame boundaries of LTE carriers in integral increments of subframes to reduce control channel overlap, related excessive power draw and a possibility of driving power amplifiers (PAs) into non-linear region of amplification; and
changing control channel transmission schedule from once every frame on every LTE carrier to a repeating pattern,
wherein:
the control channel comprises primary synchronization signal (PSS), secondary synchronization signal (SSS) and physical broadcast channel (PBCH), and
the repeating pattern includes changing the control channel transmission schedule once in each of four consecutive frames.

* * * * *